(12) United States Patent
Hsu (10) Patent No.: US 9,003,606 B2
(45) Date of Patent: *Apr. 14, 2015

(54) SYNCHRONOUS MOVEMENT DEVICE APPLIED TO DUAL-SHAFT SYSTEM

(71) Applicant: First Dome Corporation, New Taipei (TW)

(72) Inventor: An Szu Hsu, New Taipei (TW)

(73) Assignee: First Dome Corporation, New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/037,690

(22) Filed: Sep. 26, 2013

(65) Prior Publication Data

US 2014/0251045 A1    Sep. 11, 2014

Related U.S. Application Data

(63) Continuation-in-part of application No. 13/914,768, filed on Jun. 11, 2013.

(30) Foreign Application Priority Data

Mar. 11, 2013  (TW) .............................. 102108559 A (51) Int. Cl.
| | |
|---|---|
| *E05D 3/06* | (2006.01) |
| *E05D 3/18* | (2006.01) |
| *E05D 3/12* | (2006.01) |
| *H05K 7/16* | (2006.01) |
| *E05D 7/00* | (2006.01) |
| *F16H 25/18* | (2006.01) |

(52) U.S. Cl.
CPC .. *H05K 7/16* (2013.01); *E05D 3/12* (2013.01); *E05D 3/18* (2013.01); *E05D 3/06* (2013.01); *E05D 7/00* (2013.01); *F16H 25/186* (2013.01)

(58) Field of Classification Search
CPC ................ E05D 3/06; E05D 3/18; E05D 3/12
USPC .......... 16/366, 368, 371, 365, 302, 312, 313, 16/315, 316, 357, 358; 49/67, 463, 116, 49/104
See application file for complete search history.

(56) References Cited

U.S. PATENT DOCUMENTS

| | | | | |
|---|---|---|---|---|
| 4,200,957 | A * | 5/1980 | Hsu .................................. | 16/314 |
| 4,242,773 | A * | 1/1981 | Beigh .............................. | 16/371 |
| 5,666,694 | A * | 9/1997 | Slow et al. ...................... | 16/368 |
| 7,414,834 | B2 * | 8/2008 | Ukonaho et al. ......... | 361/679.55 |
| 7,512,426 | B2 * | 3/2009 | Maatta et al. .............. | 455/575.1 |
| 7,738,930 | B2 * | 6/2010 | Petrella ....................... | 455/575.3 |
| 7,765,644 | B2 * | 8/2010 | Ueyama et al. ................. | 16/354 |
| 7,900,323 | B2 * | 3/2011 | Lin ................................. | 16/366 |
| 8,474,101 | B2 * | 7/2013 | Wang et al. ..................... | 16/366 |

(Continued)

*Primary Examiner* — Jeffrey O Brien
(74) *Attorney, Agent, or Firm* — Rosenberg, Klein & Lee (57) ABSTRACT

A synchronous movement device applied to dual-shaft system includes a first shaft and a second shaft, which are assembled with each other and synchronously rotatable. The synchronous movement device further includes a driver and a driving rail disposed on the first shaft, a reactor and a reacting rail disposed on the second shaft and a link unit connected between the driver and the reactor. When the first shaft drives the driver to rotate, the driver pushes the link unit to move along the first and second shafts to forcedly push the reactor to rotate in a direction reverse to the moving direction of the driver. Accordingly, the first and second shafts are synchronously rotated.

26 Claims, 5 Drawing Sheets

(56) References Cited

U.S. PATENT DOCUMENTS

| | | | |
|---|---|---|---|
| 8,615,848 B2* | 12/2013 | Mitsui | 16/366 |
| 2006/0236505 A1* | 10/2006 | Maatta et al. | 16/366 |
| 2006/0238970 A1* | 10/2006 | Ukonaho et al. | 361/683 |
| 2008/0307608 A1* | 12/2008 | Goto | 16/366 |
| 2009/0000062 A1* | 1/2009 | Yamanami | 16/366 |
| 2009/0013500 A1* | 1/2009 | Ueyama et al. | 16/354 |
| 2011/0157780 A1* | 6/2011 | Wang et al. | 361/679.01 |
| 2011/0289726 A1* | 12/2011 | Zhang et al. | 16/250 |
| 2012/0096678 A1* | 4/2012 | Zhang et al. | 16/302 |
| 2013/0318746 A1* | 12/2013 | Kuramochi | 16/342 |

* cited by examiner

SYNCHRONOUS MOVEMENT DEVICE APPLIED TO DUAL-SHAFT SYSTEM

This application is a continuation-in-part application of U.S. patent application Ser. No. 13/914,768, filed 11 Jun. 2013, entitled "SYNCHRONOUS MOVEMENT DEVICE APPLIED TO DUAL-SHAFT SYSTEM", currently pending.

BACKGROUND OF THE INVENTION

1. Field of the Invention

The present invention relates generally to a synchronous movement device applied to dual-shaft system including a first shaft and a second shaft. The synchronous movement device includes a driver and a driving rail disposed on the first shaft, a reactor and a reacting rail disposed on the second shaft and a link unit connected between the driver and the reactor. In operation, the driver, the driving rail, the link unit, the reactor and reacting rail serve to transmit force to make the first and second shafts synchronously rotate.

2. Description of the Related Art

There are various electronic apparatuses provided with covers or display screens or viewers, such as mobile phones, notebooks, PDA, digital imagers and electronic books. The covers or display screens or viewers are pivotally mounted on the electronic apparatuses via pivot pins or rotary shafts, whereby the covers or display screens or viewers can be freely rotated and opened/closed under external force.

In order to operate the display module (such as the screen) and/or the apparatus body module of the electronic apparatus in more operation modes and application ranges, a dual-shaft mechanism is provided between the display module and the apparatus body module, whereby the display module and/or the apparatus body module can be operated in different operation modes by different rotational angles.

In the above conventional pivot pin structures or rotary shaft structures, generally multiple gaskets with through holes and recessed/raised locating sections, multiple frictional plates and multiple cooperative springs are assembled on the rotary shaft. Two ends of the rotary shaft are respectively fixed by means of retainer rings or retainer members. The springs serve to store energy and release the energy to achieve the objects of rotating and locating the rotary shaft or pivot pin assembly. Basically, the above structures are relatively complicated and it is hard to assemble the structures. Moreover, after a period of operation, the recessed/raised locating sections of the gaskets or frictional plates are likely to wear. This will affect the locating effect.

There is also a conventional mechanism composed of rollers and drive wires (or transmission belts) for transmitting force to the rotary shaft so as to rotate the rotary shaft. As known by those who are skilled in this field, during the operation process of the wires or the transmission belts, delay of kinetic energy transmission will take place. This is because there is a gap between the wires (or transmission belts) and the rollers and the wires (or transmission belts) will slip or untruly operate. Also, the wires (or transmission belts) are made of elastic material and the fixing structure for assembling the wires (or transmission belts) with the rollers is not ideal. As a result, in force transmission, the load on the wires or the pulling force applied to the wires will increase. In this case, the transmission and shift effect of the wires will be deteriorated and the wires may detach from the rollers. Especially, after a period of use, the force of the wires or transmission belts, which is preset in the assembling process will decrease due to elastic failure. Under such circumstance, the synchronous movement effect of the transmission mechanism will be deteriorated.

In some cases, the wires or transmission belts have serious elastic fatigue and often detach from the rollers during the movement of the slide cover module. Under such circumstance, the rotary shaft device will lose its synchronous displacement effect.

There is another problem existing in the application and manufacturing of the wires or transmission belts. That is, during the assembling process of the wires or transmission belts, the wires or transmission belts need to be tensioned. This will make it more difficult to control the quality of wiring and assembling. Therefore, the ratio of good products can be hardly promoted and the assembling time can be hardly shortened. As a result, the manufacturing cost is increased.

In order to improve the above problems, a conventional dual-shaft synchronous movement device has been developed. Such dual-shaft synchronous movement device employs multiple gears for transmitting force. However, as known by those who are skilled in this field, with the transmission gears, the gap between the shafts of the dual-shaft synchronous movement device can be hardly minified. Therefore, the entire transmission unit or structure will occupy a considerably large space. Especially, when the transmission unit is applied to a notebook or a miniaturized electronic device, the electronic device can hardly meet the requirement for lightweight and slimmed design. This is not what we expect.

The conventional rotary shaft structures and the relevant connection components thereof have some shortcomings in use and structural design that need to be overcome. It is therefore tried by the applicant to provide a dual-shaft synchronous movement device and an assembling method thereof to eliminate the shortcomings existing in the conventional rotary shaft structure so as to widen the application range and facilitate the assembling process of the rotary shaft structure.

The synchronous movement device applied to the dual-shaft system of the present invention has the following advantages:

1. The synchronous movement device of the present invention is mounted between the display module and the apparatus body module. When an operator 0°~180° rotates the display module, the apparatus body module is synchronously relatively 0°~180° rotated. Therefore, the total rotational angle of the display module and the apparatus body module is 360°. Accordingly, the operator can more quickly and conveniently operate the electronic apparatus in more operation modes (or application ranges). Also, the synchronous movement effect and operational stability of the synchronous movement device and the cooperative rotary shafts are enhanced.

2. The synchronous movement device or transmission mechanism of the present invention is free from any of the gaskets with through holes and recessed/raised locating sections and the frictional plates as well as the springs employed in the conventional rotary shaft structures. Therefore, the problems existing in the conventional technique that the structures are relatively complicated and it is hard to assemble the structures and the recessed/raised locating sections of the gaskets or frictional plates are likely to wear can be apparently improved.

3. The synchronous movement device of the present invention overcomes the problem of delay of kinetic energy transmission of the conventional wires or transmission belts. The synchronous movement device of the present invention also solves the problem of the conventional transmission mechanism that there is a gap between the wires and the rollers so that the wires will slip or untruly operate. The synchronous movement device of the present invention also solves the problem of the conventional transmission mechanism that the fixing structure for assembling the wires with the rollers is not ideal so that in force transmission, the load on the wires or the pulling force applied to the wires will increase to deteriorate the transmission effect.

4. The synchronous movement device or transmission mechanism of the present invention is free from any gear for transmitting force as in the conventional technique. Therefore, the gap between the shafts can be as minified as possible. Therefore, the space occupied by the entire transmission unit or structure is reduced. Accordingly, when the transmission unit is applied to an electronic device, the electronic device can meet the requirement for lightweight and slimmed design.

SUMMARY OF THE INVENTION

It is therefore a primary object of the present invention to provide a synchronous movement device applied to dual-shaft system including a first shaft and a second shaft. The synchronous movement device includes a driver and a driving rail disposed on the first shaft, a reactor and a reacting rail disposed on the second shaft and a link unit connected between the driver and the reactor. In operation, the driver, the link unit and the reactor serve to transmit force to make the first and second shafts synchronously rotate.

In the above synchronous movement device applied to dual-shaft system, a subsidiary driver is further disposed on the first shaft and a subsidiary reactor is further disposed on the second shaft. The driver, the subsidiary driver, the reactor and the subsidiary reactor are in the form of a roller, each having a slope.

In the above synchronous movement device applied to dual-shaft system, each of the slope of the driver and the slope of the subsidiary driver includes a first slope and a second slope. Each of the driver and the subsidiary driver has an axial sleeve and a shaft hole formed on the sleeve. By means of the shaft holes, the driver and the subsidiary driver are mounted on the first shaft with the first slope of the driver in contact with the first slope of the subsidiary driver and the second slope of the driver in contact with the second slope of the subsidiary driver to define the (spiral) driving rail.

In the above synchronous movement device applied to dual-shaft system, each of the slope of the reactor and the slope of the subsidiary reactor includes a first slope and a second slope. Each of the reactor and the subsidiary reactor has an axial sleeve and a shaft hole formed on the sleeve. By means of the shaft holes, the reactor and the subsidiary reactor are mounted on the second shaft with the first slope of the reactor in contact with the first slope of the subsidiary reactor and the second slope of the reactor in contact with the second slope of the subsidiary reactor to define the (spiral) reacting rail.

In the above synchronous movement device applied to dual-shaft system, the link unit has a driving boss and a reacting boss respectively positioned in the driving rail and the reacting rail.

When the first shaft drives the driver to rotate, in cooperation with the driving rail, the driving boss and the link unit are pushed to move in a direction parallel to the first and second shafts. At this time, the reacting boss moves along the reacting rail to push the reactor (and the subsidiary reactor) to rotate, whereby the second shaft is synchronously rotated in a direction reverse to the rotational direction of the first shaft.

The present invention can be best understood through the following description and accompanying drawings, wherein:

DETAILED DESCRIPTION OF THE PREFERRED EMBODIMENTS

Figure 1:
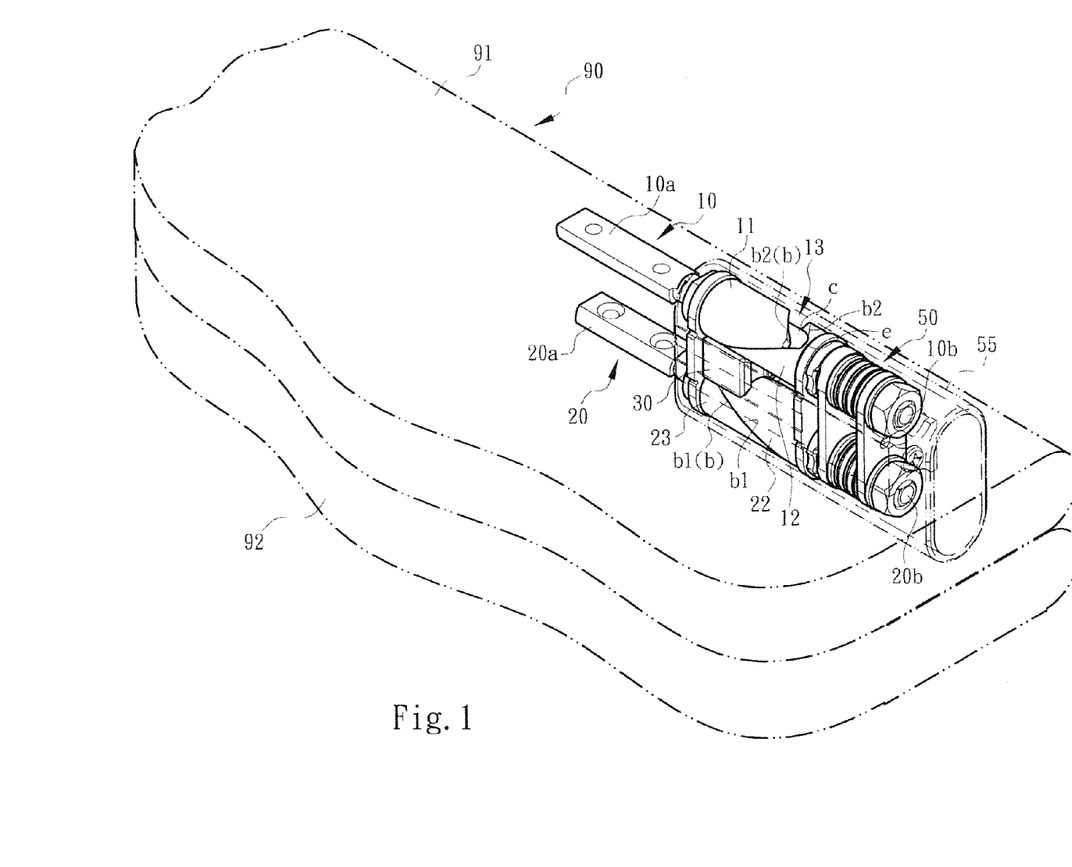
FIG. 1 is a perspective assembled view of the synchronous movement device of the present invention and the casing thereof, in which the phantom lines show that the display module is closed on the apparatus body module.
Figure 2:
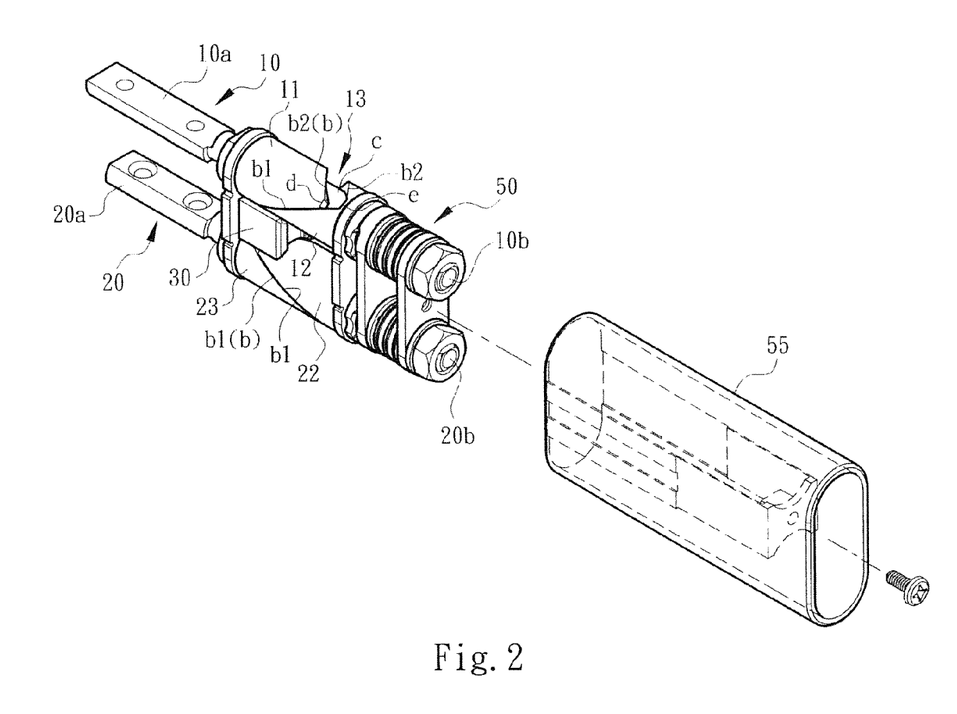
FIG. 2 is a front perspective view of the synchronous movement device of the present invention.
Figure 3:
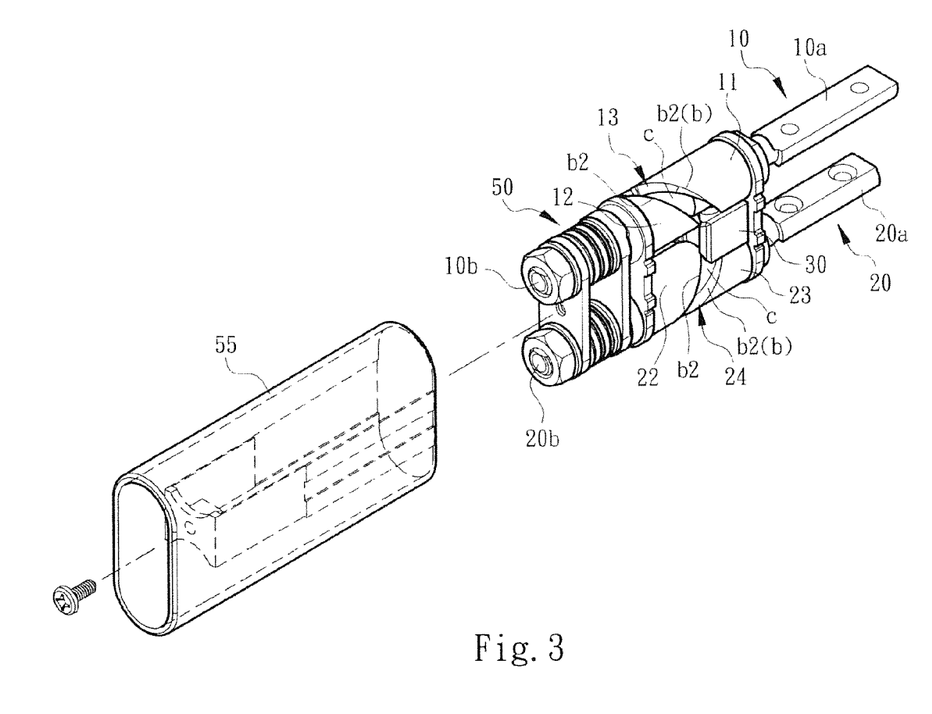
FIG. 3 is a rear perspective view of the synchronous movement device of the present invention.

Please refer to FIGS. 1, 2 and 3. The synchronous movement device applied to dual-shaft system of the present invention includes a first shaft 10 and a second shaft 20. The first and second shafts 10, 20 are assembled with each other and disposed in a casing 55. Each of the first and second shafts 10, 20 has a fixed end 10a, 20a and a pivoted end 10b, 20b. Through fixing seats (not shown), the fixed ends 10a, 20a of the first and second shafts 10, 20 are respectively fixed on a display module 91 and an apparatus body module 92 of an electronic apparatus 90 (such as a mobile phone or a computer).

Figure 4:
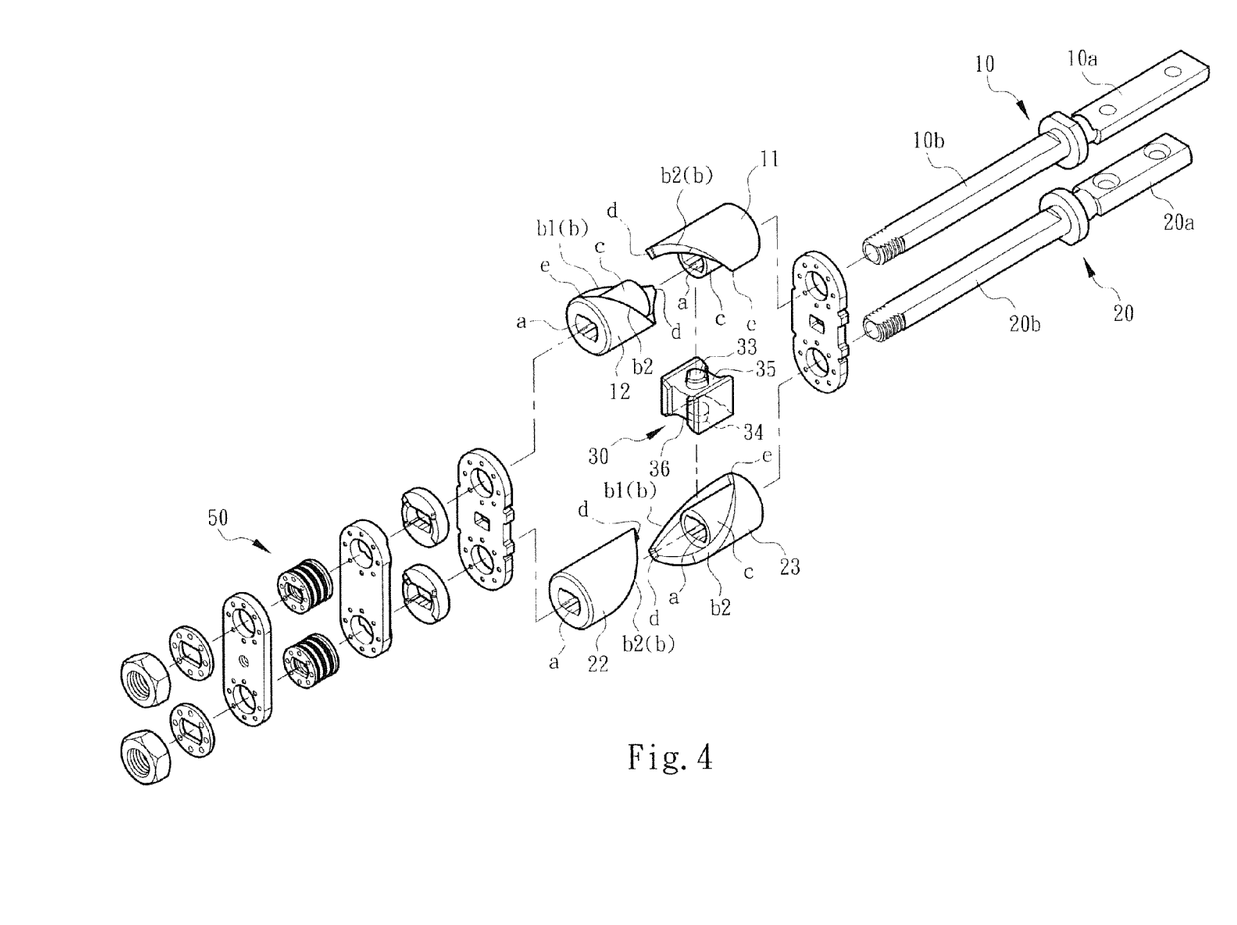
FIG. 4 is a perspective exploded view of the synchronous movement device of the present invention according to FIG. 3, showing the positional relationship between the first and second shafts, the driver, the subsidiary driver, the link unit, the reactor and the subsidiary reactor.

Please refer to FIGS. 2, 3 and 4. The pivoted end 10b of the first shaft 10 is provided with a driver 11 and a subsidiary driver 12 rotatable with the first shaft 10. The pivoted end 20b of the second shaft 20 is provided with a reactor 22 and a subsidiary reactor 23 synchronously rotatable with the second shaft 22. In addition, a link unit 30 is connected with the driver 11 (or the subsidiary driver 12) and the reactor 22 (or the subsidiary reactor 23). The driver 11, the subsidiary driver 12, the reactor 22, the subsidiary reactor 23 and the link unit 30 are assembled on the first and second shafts 10, 20 via a fixing assembly 50. When the first shaft 10 drives the driver 11 (or the subsidiary driver 12) to rotate, the link unit 30 is pushed and displaced to forcedly rotate the reactor 22 (or the subsidiary reactor 23) in a direction reverse to the moving direction of the driver 11, whereby the first and second shafts 10, 20 are synchronously rotated.

In this embodiment, the driver 11, the subsidiary driver 12, the reactor 22 and the subsidiary reactor 23 are in the form of a roller. Each of these components has a shaft hole a, whereby the driver 11, the subsidiary driver 12, the reactor 22 and the subsidiary reactor 23 can be respectively fitted on the pivoted ends 10b, 20b of the first and second shafts 10, 20. As shown in the drawings, the shaft hole a has a cross-sectional configuration identical to that of the pivoted ends 10b, 20b of the first and second shafts. For example, in the drawings, the pivoted ends 10b, 20b of the first and second shafts have a rectangular cross section and the shaft hole a has an identical rectangular cross section, whereby the pivoted ends 10b, 20b of the first and second shafts can be fitted in the shaft hole a. In this case, the driver 11 and the subsidiary driver 12 are rotatable with the first shaft 10, while the reactor 22 and the subsidiary reactor 23 are rotatable with the second shaft 20.

Referring to FIGS. 2, 3 and 4, each of the driver 11, the subsidiary driver 12, the reactor 22 and the subsidiary reactor 23 has a slope b. Each of the slope b of the driver 11 and the slope b of the subsidiary driver 12 includes a first slope b1 and a second slope b2. Each of the driver 11 and the subsidiary driver 12 has an axial sleeve c formed with the shaft hole a. By means of the shaft holes a, the driver 11 and the subsidiary driver 12 are mounted on the pivoted end 10b of the first shaft 10 with the first slope b1 of the driver 11 in contact with the first slope b1 of the subsidiary driver 12 (and the sleeve c of the driver 11 also in contact with the sleeve c of the subsidiary driver 12) and the second slope b2 of the driver 11 in contact with the second slope b2 of the subsidiary driver 12 to define a (spiral) driving rail 13.

Each of the slope b of the reactor 22 and the slope b of the subsidiary reactor 23 includes a first slope b1 and a second slope b2. Each of the reactor 22 and the subsidiary reactor 23 has an axial sleeve c formed with the shaft hole a. By means of the shaft holes a, the reactor 22 and the subsidiary reactor 23 are mounted on the pivoted end 20b of the second shaft 20 with the first slope b1 of the reactor 22 in contact with the first slope b1 of the subsidiary reactor 23 (and the sleeve c of the reactor 22 also in contact with the sleeve c of the subsidiary reactor 23) and the second slope b2 of the reactor 22 in contact with the second slope b2 of the subsidiary reactor 23 to define a (spiral) reacting rail 24.

To speak more specifically, a ridge section d and a valley section e are formed between the first slope b1 and the second slope b2. The length of the first slope b1 (between the ridge section d and the valley section e) is smaller than the length of the second slope b2 (between the ridge section d and the valley section e).

It should be noted that the first slope b1 and a reference axis (such as the axis of the first shaft 10 or the second shaft 20) contain an angle of 30°~60° and the second slope b2 and the reference axis contain an angle of 30°~60°.

In this embodiment, the angle is preferably 45° to facilitate the cooperation between the driver 11, the subsidiary driver 12, the reactor 22, the subsidiary reactor 23 and the link unit 30.

It should be noted that with the axis of the first shaft 10 or the second shaft 20 as a reference, the first slopes b1 of the driver 11 and the subsidiary driver 12 are inclined in a direction reverse to the inclination direction of the first slopes b1 of the reactor 22 and the subsidiary reactor 23, and the second slopes b2 of the driver 11 and the subsidiary driver 12 are inclined in a direction reverse to the inclination direction of the second slopes b2 of the reactor 22 and the subsidiary reactor 23. Also, the spiral direction of the driving rail 13 is reverse to the spiral direction of the reacting rail 24.

Referring to FIGS. 2, 3 and 4, the second slope b2 of the driver 11 and the second slope b2 of the subsidiary driver 12 together define the driving rail 13 and the second slope b2 of the reactor 22 and the second slope b2 of the subsidiary reactor 23 together define the reacting rail 24. Corresponding to the driving rail 13 and the reacting rail 24, the link unit 30 is a block body formed with a first concaved face 35 and a second concaved face 36 in adaptation to the configuration of the driver 11, the subsidiary driver 12, the reactor 22 and the subsidiary reactor 23. A driving boss 33 is disposed on the first concaved face 35 and a reacting boss 34 is disposed on the second concaved face 36. The driving boss 33 and the reacting boss 34 are respectively positioned in the driving rail 13 and the reacting rail 24.

Figure 5:
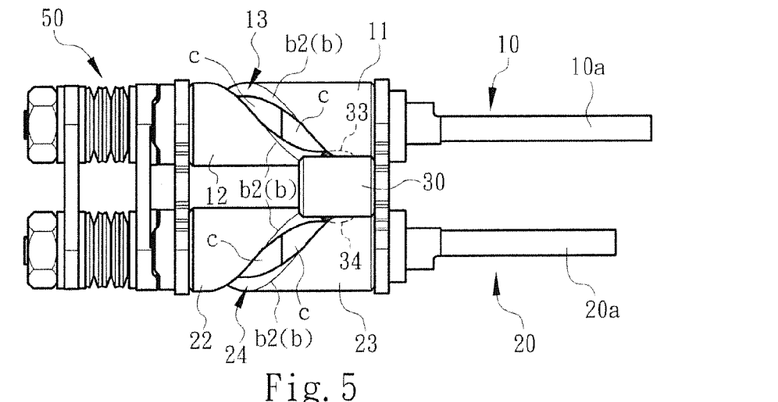
FIG. 5 is a plane view of the synchronous movement device of the present invention.
Figure 6:
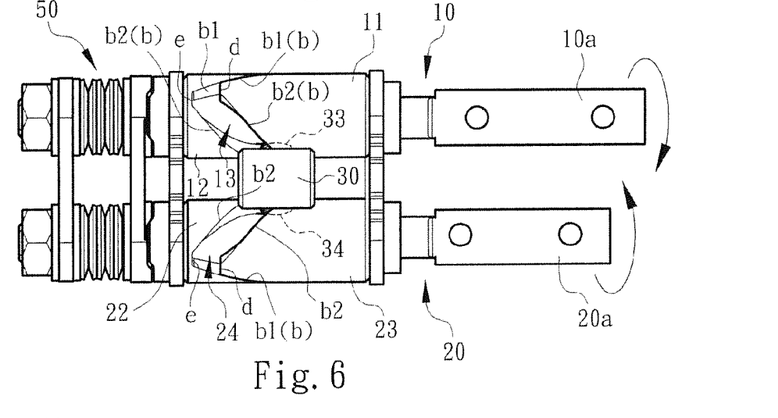
FIG. 6 is a plane view of the synchronous movement device of the present invention according to FIG. 5, showing that the first shaft, the driver and the subsidiary driver are 90° rotated to synchronously move the link unit, the reactor, the subsidiary reactor and the second shaft.
Figure 7:
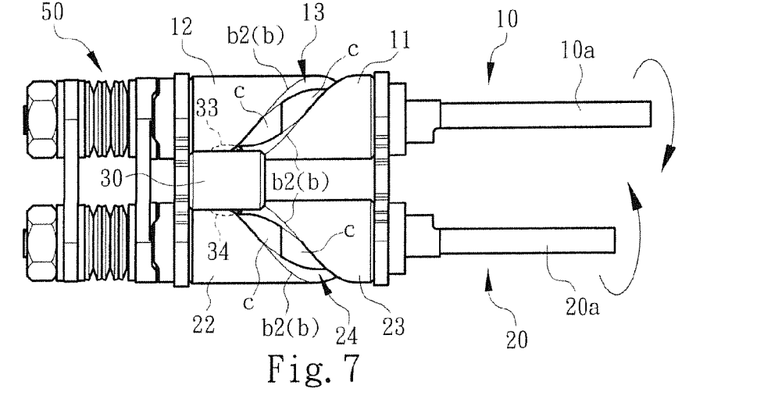
FIG. 7 is a plane view of the synchronous movement device of the present invention according to FIG. 5, showing that the first shaft, the driver and the subsidiary driver are 180° rotated to synchronously move the link unit, the reactor, the subsidiary reactor and the second shaft.

Please refer to FIGS. 5, 6 and 7. When the first shaft 10 drives the driver 11 to rotate, in cooperation with the driving rail 13, the link unit 30 is pushed to move in a direction parallel to the first and second shafts 10, 20. At this time, the reacting boss 34 moves along the reacting rail 24 to push the reactor 22 to rotate, whereby the second shaft 20 (and the subsidiary reactor 23) are synchronously rotated in a direction reverse to the rotational direction of the first shaft 10.

To speak more specifically, when the display module 91 is closed onto the apparatus body module 92, the angle contained therebetween is defined 0°. Please refer to FIGS. 5 and 6, when an operator opens the display module 91 to make the first shaft 10 drive the driver 11 (or the subsidiary driver 12) to 90° rotate, the driving rail 13 pushes the driving boss 33 of the link unit 30 to make the link unit 30 move leftward as shown in FIG. 6.

Please refer to FIGS. 6 and 7. When the link unit 30 is moved, the reacting boss 34 is moved leftward along the reacting rail 24 to push the reactor 22 (or the subsidiary reactor 23), whereby the reactor 22 is rotated in a direction reverse to the rotational direction of the driver 11 (or the subsidiary driver 12) and the second shaft 20 and the subsidiary reactor 23 are synchronously rotated in a direction reverse to the rotational direction of the first shaft 10.

Accordingly, as shown in FIG. 6, when the operator opens the display module 91 to make the first shaft 10 counterclockwise rotate to a 90° position, the driver 11, the subsidiary driver 12, the link unit 30, the reactor 22 and the subsidiary reactor 23 cooperate with each other to transmit the force and make the second shaft 20 (or the apparatus body module 92) synchronously clockwise rotates to a 90° position. That is, the first and second shafts 10, 20 (or the display module 91 and the apparatus body module 92) are totally relatively rotated by 180°.

Referring to FIG. 7, when the operator opens the display module 91 to make the first shaft 10 counterclockwise rotate to a 180° position, the second shaft 20 (or the apparatus body module 92) synchronously clockwise rotates to a 180° position. That is, the first and second shafts 10, 20 (or the display module 91 and the apparatus body module 92) are totally relatively rotated by 360°.

That is, by means of the synchronous movement device, a user can operate and rotate the display module 91 by a certain angle or range to achieve a travel double the rotational angle or range. Accordingly, the user can more quickly and conveniently operate the electronic apparatus.

It should be noted that during the force transmission process of the synchronous movement device of the present invention, the driver 11 (and/or the subsidiary driver 12), the link unit 30 and the reactor 22 (and/or the subsidiary reactor 23) are cooperatively assembled with each other to minimize the possibility of torque change or slippage that often happens in the conventional device. In this case, the first and second shafts 10, 20 can be smoothly rotated. Moreover, once the rotational force disappears, the rotors stop rotating to be located in a desired position.

It should be noted that FIGS. 1, 2 and 3 (or 5, 6 and 7) show that the length of the link unit 30 is as minimized as possible.

In practice, total length of the driver 11 and the subsidiary driver 12 (or the reactor 22 and the subsidiary reactor 23) and the link unit 30 on the first shaft 10 (or the second shaft 20) is only about 13 mm. Obviously, the length and volume of the entire synchronous movement device are as minimized as possible.

In comparison with the conventional device, the synchronous movement device of the dual-shaft system of the present invention has the following advantages:

1. The rotary shafts (the first and second shafts 10, 20) are the relevant components such as the driver 11 (and/or the subsidiary driver 12), the link unit 30 and the reactor 22 (and/or the subsidiary reactor 23) together form a synchronous movement mechanism. This structure is apparently different from the conventional device, which employs multiple gears or rollers and drive wires (or transmission belts) for transmitting force and rotating the rotary shafts or multiple gaskets, frictional plates and cooperative springs for storing energy and releasing the energy.
2. The driver 11 (and/or the subsidiary driver 12) and the reactor 22 (and/or the subsidiary reactor 23) and the cooperative link unit 30 together form a synchronous movement device. The synchronous movement device is mounted between the display module 91 and the apparatus body module 92. When an operator 0°~180° rotates the display module 91, the apparatus body module will synchronously relatively rotate by 0 °~180°. Accordingly, the total rotational angle of the display module 91 and the apparatus body module 92 is 360°. That is, by means of the synchronous movement device, a user can operate and rotate the display module 91 by a certain angle or range to achieve a travel double the rotational angle or range. Accordingly, the user can more quickly and conveniently operate the electronic apparatus in more operation modes (or application ranges).
3. The driver 11 (and/or the subsidiary driver 12) and the reactor 22 (and/or the subsidiary reactor 23) and the cooperative link unit 30 together form a synchronous transmission structure different from the conventional transmission mechanism and relevant cooperative structures. The synchronous movement device of the present invention overcomes the problem of delay of kinetic energy transmission of the conventional wires or transmission belts. The synchronous movement device of the present invention also solves the problem of the conventional transmission mechanism that there is a gap between the wires and the rollers so that the wires will slip or untruly operate. The synchronous movement device of the present invention also solves the problem of the conventional transmission mechanism that the fixing structure for assembling the wires with the rollers is not ideal so that in force transmission, the load on the wires or the pulling force applied to the wires will increase to deteriorate the transmission effect.
4. The driver 11 (and/or the subsidiary driver 12) and the reactor 22 (and/or the subsidiary reactor 23) and the cooperative link unit 30 together form a synchronous transmission structure advantageous over the conventional transmission mechanism in that the synchronous transmission structure is easier to manufacture and assemble. Moreover, the synchronous movement device or transmission mechanism of the present invention is free from any gear for transmitting force as in the conventional technique. Therefore, the gap between the shafts can be as minified as possible. Therefore, the space occupied by the entire transmission unit or structure is reduced. Accordingly, when the transmission unit is applied to an electronic device, the electronic device can meet the requirement for lightweight and slimmed design.

In conclusion, the synchronous movement device applied to the dual-shaft system of the present invention is different from and advantageous over the conventional device.

The above embodiments are only used to illustrate the present invention, not intended to limit the scope thereof. Many modifications of the above embodiments can be made without departing from the spirit of the present invention.

What is claimed is:

1. A synchronous movement device applied to dual-shaft system, comprising:
   a first shaft having a fixed end and a pivoted end;
   a driver and a driving rail disposed at the pivoted end of the first shaft;
   a subsidiary driver disposed at the pivoted end of the first shaft, the subsidiary driver being rotatable with the first shaft;
   a second shaft having a fixed end and a pivoted end;
   a reactor and a reacting rail disposed at the pivoted end of the second shaft;
   a subsidiary reactor disposed at the pivoted end of the second shaft, the subsidiary reactor being synchronously rotatable with the second shaft;
   each of the driver, the subsidiary driver, the reactor and the subsidiary reactor including an outer surface peripherally terminating at a first slope and a second slope, the first slope of the driver being in contact with the first slope of the subsidiary driver, the driving rail being defined between the second slope of the driver and the second slope of the subsidiary driver, the first slope of the reactor being in contact with the first slope of the subsidiary reactor, the reacting rail being defined between the second slope of the reactor and the second slope of the subsidiary reactor; and
   a link unit having a driving boss and a reacting boss respectively positioned in the driving rail and the reacting rail, the link unit having first and second faces slidably engaging at least one of the driver and subsidiary driver outer surfaces and at least one of the reactor and subsidiary reactor outer surfaces, respectively, the driver being rotatable with the first shaft to push the link unit to move along the first and second shafts so as to make the reactor rotate in a direction reverse to a moving direction of the driver, whereby the first and second shafts are synchronously rotated.

2. The synchronous movement device applied to dual-shaft system as claimed in claim 1, wherein the driver, the subsidiary driver, the reactor, the subsidiary reactor and the link unit are assembled on the first and second shafts by means of fixing members.

3. The synchronous movement device applied to dual-shaft system as claimed in claim 1, wherein the driver, the subsidiary driver, the reactor and the subsidiary reactor are in the form of a roller, each of the driver, the subsidiary driver, the reactor and the subsidiary reactor having a shaft hole, whereby the driver, the subsidiary driver, the reactor and the subsidiary reactor are respectively fitted on the pivoted end of the first shaft and the pivoted end of the second shaft.

4. The synchronous movement device applied to dual-shaft system as claimed in claim 3, wherein the driving rail is a spiral structure.

5. The synchronous movement device applied to dual-shaft system as claimed in claim 3, wherein the reacting rail is a spiral structure.

6. The synchronous movement device applied to dual-shaft system as claimed in claim 4, wherein the reacting rail is a spiral structure.

7. The synchronous movement device applied to dual-shaft system as claimed in claim 3, wherein each of the driver and the subsidiary driver has an axial sleeve formed with the shaft hole, by means of the shaft holes, the driver and the subsidiary driver being mounted on the pivoted end of the first shaft with the sleeve of the driver in contact with the sleeve of the subsidiary driver, each of the reactor and the subsidiary reactor having an axial sleeve formed with the shaft hole, by means of the shaft holes, the reactor and the subsidiary reactor being mounted on the pivoted end of the second shaft with the sleeve of the reactor in contact with the sleeve of the subsidiary reactor.

8. The synchronous movement device applied to dual-shaft system as claimed in claim 3, wherein each shaft hole has a cross-sectional configuration identical to that of the pivoted ends of the first and second shafts.

9. The synchronous movement device applied to dual-shaft system as claimed in claim 7, wherein each shaft hole has a cross-sectional configuration identical to that of the pivoted ends of the first and second shafts.

10. The synchronous movement device applied to dual-shaft system as claimed in claim 7, wherein the pivoted ends of the first and second shafts have a rectangular cross section and each shaft hole has an identical rectangular cross section.

11. The synchronous movement device applied to dual-shaft system as claimed in claim 3, wherein a ridge section and a valley section are formed between the first and second slopes of each of the driver and the subsidiary driver, the first slope having a length smaller than a length of the second slope.

12. The synchronous movement device applied to dual-shaft system as claimed in claim 3, wherein the first slope of each of the driver and the subsidiary driver and a reference axis contain an angle of 30°~60° and the second slope of each of the driver and the subsidiary driver and the reference axis contain an angle of 30°~60 °.

13. The synchronous movement device applied to dual-shaft system as claimed in claim 3, wherein the first slope of each of the reactor and the subsidiary reactor and a reference axis contain an angle of 30°~60° and the second slope of each of the reactor and the subsidiary reactor and the reference axis contain an angle of 30°~60 °.

14. The synchronous movement device applied to dual-shaft system as claimed in claim 12, wherein the first and the second slope angles are45°.

15. The synchronous movement device applied to dual-shaft system as claimed in claim 13, wherein the first and the second slope angles are 45°.

16. The synchronous movement device applied to dual-shaft system as claimed in claim 3, wherein the first slopes of the driver and the subsidiary driver are inclined in a direction reverse to an inclination direction of the first slopes of the reactor and the subsidiary reactor, the second slopes of the driver and the subsidiary driver being inclined in a direction reverse to an inclination direction of the second slopes of the reactor and the subsidiary reactor, the driving rail and the reacting rail being spiral structures, the spiral direction of the driving rail being reverse to the spiral direction of the reacting rail.

17. The synchronous movement device applied to dual-shaft system as claimed in claim 1, wherein the link unit is a block body.

18. The synchronous movement device applied to dual-shaft system as claimed in claim 3, wherein the link unit is a block body.

19. The synchronous movement device applied to dual-shaft system as claimed in claim 7, wherein the link unit is a block body.

20. The synchronous movement device applied to dual-shaft system as claimed in claim 18, wherein the first and second faces of link unit is respectively formed with a first concaved face and a second concaved face, the driving boss being disposed on the first concaved face and the reacting boss being disposed on the second concaved face.

21. The synchronous movement device applied to dual-shaft system as claimed in claim 19, wherein the first and second faces of link unit is respectively formed with a first concaved face and a second concaved face, the driving boss being disposed on the first concaved face and the reacting boss being disposed on the second concaved face.

22. The synchronous movement device applied to dual-shaft system as claimed in claim 3, wherein the pivoted end of the first shaft, the pivoted end of the second shaft, the driver, the subsidiary driver, the reactor, the subsidiary reactor and the link unit are assembled with each other and disposed in a casing.

23. The synchronous movement device of dual-shaft system as claimed in claim 1, wherein the fixed end of the first shaft and the fixed end of the second shaft are respectively fixed on a display module and an apparatus body module of an electronic apparatus.

24. The synchronous movement device of dual-shaft system as claimed in claim 3, wherein the fixed end of the first shaft and the fixed end of the second shaft are respectively fixed on a display module and an apparatus body module of an electronic apparatus.

25. The synchronous movement device applied to dual-shaft system as claimed in claim 1, wherein when the first shaft is 0°~180° rotated, the second shaft is synchronously 0°~180° rotated in a reverse direction.

26. The synchronous movement device applied to dual-shaft system as claimed in claim 3, wherein when the first shaft is 0°~180° rotated, the second shaft is synchronously 0°~180° rotated in a reverse direction.

* * * * *